(12) United States Patent
Machalica (10) Patent No.: US 11,468,205 B2
(45) Date of Patent: Oct. 11, 2022

(54) SYSTEMS AND METHODS FOR TRANSFERRING PRODUCT MANUFACTURING INFORMATION (PMI) BETWEEN MODELS

(71) Applicant: General Electric Company, Schenectady, NY (US)

(72) Inventor: Dawid Tadeusz Machalica, Warsaw (PL)

(73) Assignee: General Electric Company, Schenectady, NY (US)

( * ) Notice: Subject to any disclaimer, the term of this patent is extended or adjusted under 35 U.S.C. 154(b) by 419 days.

(21) Appl. No.: 16/703,946

(22) Filed: Dec. 5, 2019

(65) Prior Publication Data
US 2020/0184120 A1    Jun. 11, 2020

(30) Foreign Application Priority Data

Dec. 7, 2018   (PL) .......................................... 428074

(51) Int. Cl.
*G06F 17/10*   (2006.01)
*G06F 30/12*   (2020.01)
*G06N 20/00*   (2019.01)

(52) U.S. Cl.
CPC .............. *G06F 30/12* (2020.01); *G06N 20/00* (2019.01)

(58) Field of Classification Search
CPC ... G06F 17/50; G06F 17/5004; G06F 17/5018
USPC .......................................................... 703/1
See application file for complete search history.

(56) References Cited

U.S. PATENT DOCUMENTS

| | | | |
|---|---|---|---|
| 2008/0269942 A1* | 10/2008 | Free | G06F 30/00 700/182 |
| 2013/0097489 A1 | 4/2013 | Linder et al. | |
| 2015/0339410 A1* | 11/2015 | Fisher | G06F 30/00 703/1 |
| 2018/0268536 A1 | 9/2018 | Byers et al. | |
| 2018/0268614 A1 | 9/2018 | Byers et al. | |
| 2018/0322222 A1 | 11/2018 | Cochrane et al. | |
| 2019/0354639 A1* | 11/2019 | Wu | G06T 17/00 |

FOREIGN PATENT DOCUMENTS

WO    2015183539 A1    12/2015

OTHER PUBLICATIONS

Urzad Patentowy Rzeczypospolitej Polskiej, Department Baden Patentowych, Search Report for P428074, dated Aug. 30, 2019, 6 pages.

* cited by examiner

*Primary Examiner* — Andy Ho
(74) *Attorney, Agent, or Firm* — Fletcher Yoder P.C.

(57) ABSTRACT

A system is provided. The system includes a processor for implementing a computer-aided technology (CAx) system, the CAx system including a graphical-user-interface (GUI) configured to present a first computer-aided design (CAD) model, the first CAD model including a first part. The system includes memory storing instructions configured to cause the processor to present the GUI and to display, via the GUI, a first product manufacturing information (PMI), wherein the first PMI is linked to a first feature of the first part included in the first CAD model. The instructions further cause the processor to iterate through a second CAD model to identify a second feature related to the first feature and to copy the PMI to the second feature of the second CAD model.

19 Claims, 5 Drawing Sheets

SYSTEMS AND METHODS FOR TRANSFERRING PRODUCT MANUFACTURING INFORMATION (PMI) BETWEEN MODELS

CROSS-REFERENCE TO RELATED APPLICATIONS

This application claims the benefit of Polish Patent Application No. P.428074 filed on Dec. 7, 2018, the disclosure of which is herein incorporated by reference in its entirety.

BACKGROUND

The subject matter disclosed herein relates to systems and methods for transferring product manufacturing information of a model, such as models for industrial machine parts.

Industrial machines and machine parts may be designed for a particular purpose, such as a compressor blade designed to compress air. The machine or part may contain many features shared with many portions of the part. Furthermore, these machine parts may include complex designs with many complex features. These features are typically individually managed in a computer aided design (CAD) system, despite their relationship with other components. As such, 3-dimensional (3D) models and/or 2-dimensional (2D) models may be generated to facilitate the manufacturing of the machines and/or the parts. Generally, the features associated with the part may include an attribute of the feature displayed as product and manufacturing information (PMI object) and displaying the PMI object may require a user to manually identify the features associated with the PMI object.

The PMI object may include text (e.g., indicative of PMI or characteristics of a feature) displayed on the model of the part, annotations, callouts, notes, dimensions and so forth displayed on the drawing and/or model to provide PMI. In some embodiments, PMI objects may include a visual indication providing PMI associated with a specific feature designated with the PMI object. Drawings and/or the models of the parts or assemblies may contain PMI objects used to describe a feature of the part. For example, a model may include a first PMI object indicating a first type of PMI, such as a length of the part; a second PMI object indicating a second type of PMI, such as a length of an indention of the part; a third PMI object indicating a third set of PMI, such as dimensions and tolerances of a beveled edge of the part; and the like. It may be beneficial to improve the transferring of existing PMI to other models.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the claimed subject matter. Indeed, the claimed subject matter may encompass a variety of forms that may be similar to or different from the embodiments set forth below.

In a first embodiment, system is provided. The system includes a processor for implementing a computer-aided technology (CAx) system, the CAx system including a graphical-user-interface (GUI) configured to present a first computer-aided design (CAD) model, the first CAD model including a first part. The system includes memory storing instructions configured to cause the processor to present the GUI and to display, via the GUI, a first product manufacturing information (PMI), wherein the first PMI is linked to a first feature of the first part included in the first CAD model. The instructions further cause the processor to iterate through a second CAD model to identify a second feature related to the first feature and to copy the PMI to the second feature of the second CAD model.

In a second embodiment, a method includes presenting, via a processor, a graphical user interface (GUI), and displaying, via the GUI, a first product manufacturing information (PMI), wherein the first PMI is linked to a first feature of the first part included in a first CAD model. The method further includes iterating through a second CAD model to identify a second feature related to the first feature, and copying the PMI to the second feature of the second CAD model.

In a third embodiment, a tangible, non-transitory, computer-readable medium, includes computer-readable instructions that, when executed by one or more processors of a computer, cause the one or more processors to present, via a processor, a graphical user interface (GUI), and to display, via the GUI, a first product manufacturing information (PMI), wherein the first PMI is linked to a first feature of the first part included in a first CAD model. The instructions further cause the one or more processors to iterate through a second CAD model to identify a second feature related to the first feature, and to copy the PMI to the second feature of the second CAD model.

BRIEF DESCRIPTION OF THE DRAWINGS

These and other features, aspects, and advantages of the present claimed subject matter will become better understood when the following detailed description is read with reference to the accompanying drawings in which like characters represent like parts throughout the drawings, wherein:

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present claimed subject matter, the articles "a," "an," "the," and "said" are intended to mean that there are one or more of the elements. The terms "comprising," "including," and "having" are intended to be inclusive and mean that there may be additional elements other than the listed elements.

Designing a machine or part may include certain systems and methods described in more detail below that produce a model of the part. For example, the model of the part may be created as a model-based definition included in a 2-dimensional (2D) or a 3-dimensional (3D) computer aided design (CAD) model. The techniques described herein may include the CAD model containing all part dimensional and tolerance information.

After creating the 3D CAD part, hereinafter referred to as the "part," a drawing of the part may be generated by a computer-aided technologies (e.g., CAx) system, whereby the drawing may be used to manufacture the part according to the PMI objects (e.g., annotations, callouts, notes, text, etc.) displayed on the drawing and/or model. "Model," used hereinafter, may be used to describe a 2D model, a 3D model, or any other view of a part that may be displayed on a screen, the window of a CAD system, or a sheet of paper as a drawing. As such, drawings and/or the models may contain PMI objects used to describe a feature of the part. For example, there may be an PMI object indicating that an edge has a certain bevel, a certain tolerance, finish, and the like. Likewise, three similar through-holes on a front face of a part, that the part has certain faces, certain edges, certain curves (e.g., arcs, splines), and so on. In certain embodiments, PMI from a first model may be automatically transferred into subsequent second, third, and so on, models.

Generally, a designer (e.g., person designing the part and its features) may manually identify certain information, e.g., Model Based Definition (MBD), including Product and Manufacturing Information (PMI) for parts in the first model. The details may be used to aid in the manufacturing of the part. For example, each hole may have a PMI indicating tolerances for various objects (e.g., faces, edges, holes, through-holes, faces, etc.), orientation, location, runout, and so on. In some embodiments, the MDB and PMI may adhere to standards such as ASME Y14.41-2003 Digital Product Data Definition Practices and ISO 1101:2004 Geometrical Product Specifications (GPS)—Geometrical tolerancing. Furthermore, certain PMI may be automatically detected in the first model and then recreated in the second model.

To increase efficiency and/or correct the inaccuracies that may result from having to manually identifying every feature on a portion of a part in the second model (and other models) and associating it with an PMI object, and thereby make the drawings of a part inaccurate, the CAx system may identify the similar features of a part or a portion of the part between the first and the second model, as discussed in detail below. The CAx system may then automatically copy or otherwise transfer the PMI found in the first model into the second model. Accordingly, the second model may now include PMI without having to manually identify and create such information. Detail views and section views included in the first part may also be recreated in the second part in a similar fashion Orientation of the views/position of the sections with regard to the model or its features may be the same for both models.

Figure 1:
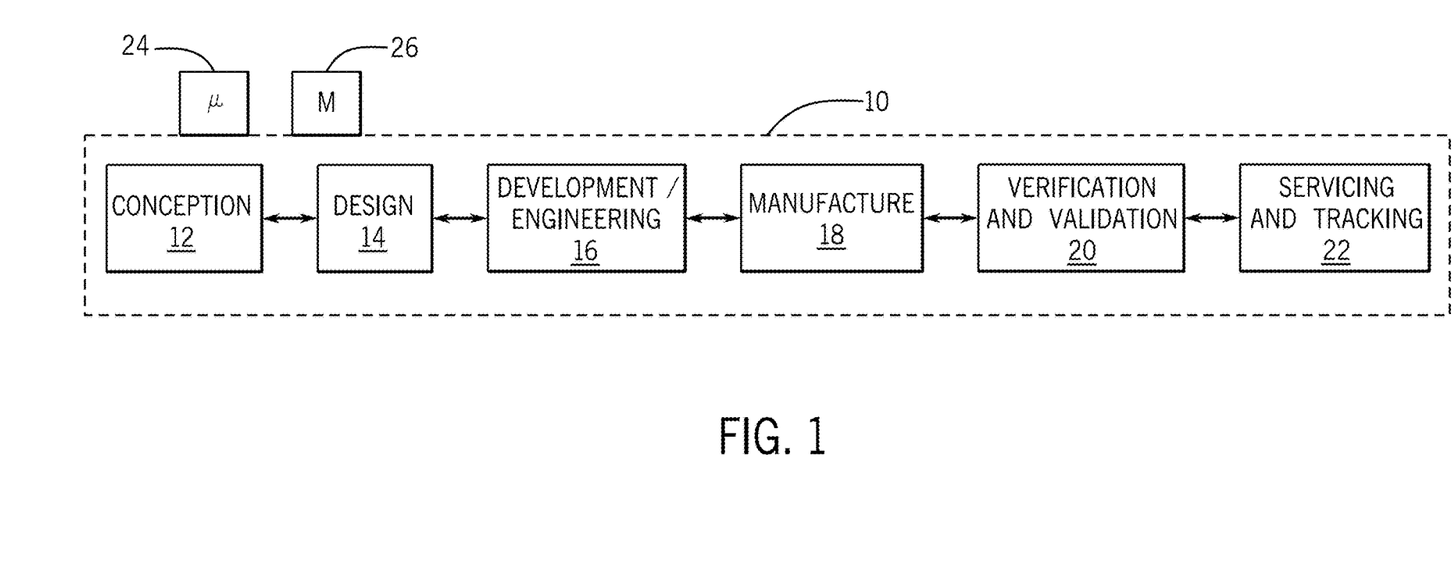
FIG. 1 is a block diagram of an embodiment of a computer-aided technology (CAx) system, in accordance with an aspect of the present disclosure.

With the foregoing in mind, it may be useful to describe a computer-aided technologies (CAx) system that may incorporate the techniques described herein, for example to improve the generation of PMI objects on model based definitions. Accordingly, FIG. 1 illustrates an embodiment of a CAx system 10 suitable for providing for a variety of processes, including PLM processes 12, 14, 16, 18, 20, 22. In the depicted embodiment, the CAx system 10 may include support for execution of conception processes 12. For example, the conception processes 12 may produce a set of specifications such as requirements specifications documenting a set of requirements to be satisfied by a design, a part, a product, or a combination thereof. The conception processes 12 may also produce a concept or prototype for the part or product (e.g., machine). A series of design processes 14 may then use the specifications and/or prototype to produce, for example, one or more 3D design models of the part or product. The 3D design models may include solid/ surface modeling, parametric models, wireframe models, vector models, non-uniform rational basis spline (NURBS) models, geometric models, 2D manufacturing part and assembly drawings, and the like.

Design models may then be further refined and added to via the execution of development/engineering processes 16. The development/engineering processes may, for example, create and apply models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models that may be used to predict the behavior of the part or product during its operation. For example, turbine blades may be modeled to predict fluid flows, pressures, clearances, and the like, during operations of a gas turbine engine. The development/engineering processes 16 may additionally result in tolerances, materials specifications (e.g., material type, material hardness), clearance specifications, and the like.

The CAx system 10 may additionally provide for manufacturing processes 18 that may include manufacturing automation support. For example, additive manufacturing models may be derived, such as 3D printing models for material jetting, binder jetting, vat photopolymerization, powder bed fusion, sheet lamination, directed energy deposition, material extrusion, and the like, to create the part or product. Other manufacturing models may be derived, such as computer numeric control (CNC) models with G-code to machine or otherwise remove material to produce the part or product (e.g., via milling, lathing, plasma cutting, wire cutting, and so on). Bill of materials (BOM) creation, requisition orders, purchasing orders, and the like, may also be provided as part of the manufacture processes 18 (or other PLM processes).

The CAx system 10 may additionally provide for verification and/or validation processes 20 that may include automated inspection of the part or product as well as automated comparison of specifications, requirements, and the like. In one example, a coordinate-measuring machine (CMM) process may be used to automate inspection of the part or product. After the part is inspected, results from the CMM process may be automatically generated via an electronic Characteristic Accountability & Verification (eCAV) system.

A servicing and tracking set of processes 22 may also be provided via the CAx system 10. The servicing and tracking processes 22 may log maintenance activities for the part, part replacements, part life (e.g., in fired hours), and so on. As illustrated, the CAx system 10 may include feedback between the processes 12, 14, 16, 18, 20, 22. For example, data from services and tracking processes 22, for example, may be used to redesign the part or product via the design processes 14. Indeed, data from any one of the processes 12, 14, 16, 18, 20, 22 may be used by any other of the processes 12, 14, 16, 18, 20, 22 to improve the part or product or to create a new part or a new product. In this manner, the CAx system 10 may incorporate data from downstream processes and use the data to improve the part or to create a new part.

The CAx system 10 may additionally include one or more processors 24 and a memory system 26 that may execute software programs to perform the disclosed techniques. Moreover, the processors 24 may include multiple microprocessors, one or more "general-purpose" microprocessors, one or more special-purpose microprocessors, and/or one or more application specific integrated circuits (ASICS), or some combination thereof. For example, the processors 24 may include one or more reduced instruction set (RISC) processors. The memory system 26 may store information such as control software, look up tables, configuration data, etc. The memory system 26 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 2:
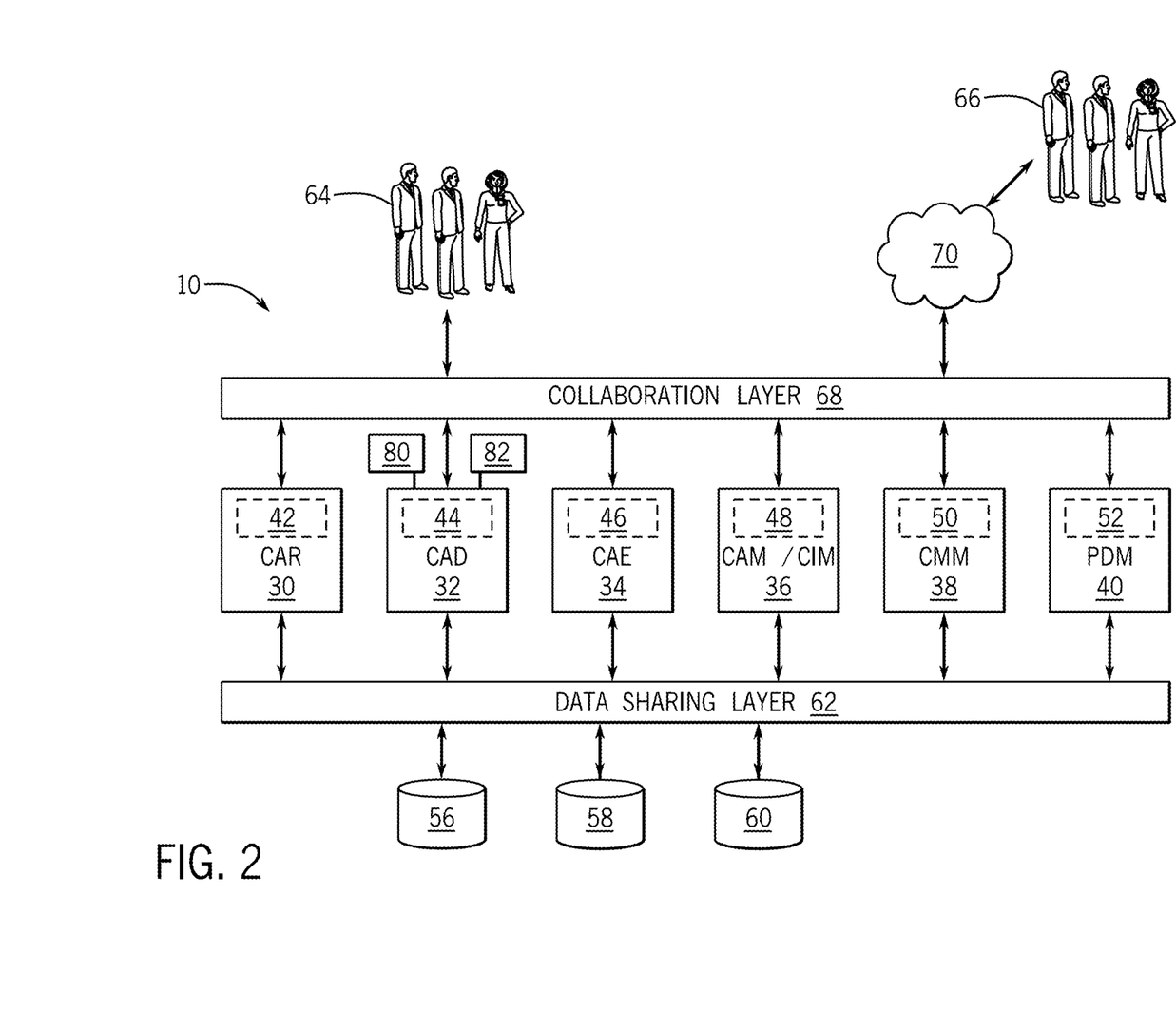
FIG. 2 is a block diagram of a certain components of the CAx system of FIG. 1, in accordance with an aspect of the present disclosure.

The memory system 26 may store a variety of information, which may be suitable for various purposes. For example, the memory system 26 may store machine-readable and/or processor-executable instructions (e.g., firmware or software) for the processors' 24 execution. In one embodiment, the executable instructions include instructions for a number of CAx based systems, for example software systems, as shown in the embodiment of FIG. 2. More specifically, the CAx system 10 embodiment illustrates a computer-aided requirements capture (CAR) system 30, a computer-aided design (CAD) system 32, a computer-aided engineering (CAE) system 34, computer-aided manufacturing/computer-integrated manufacturing (CAM/CIM) system 36, a coordinate-measuring machine (CMM) system 38, and a product data management (PDM) system 40. Each of the systems 30, 32, 34, 36, 38 and 40 may be extensible and/or customizable, accordingly, each system 30 may include an extensibility and customization system 42, 44, 46, 48, 50, and 52, respectively. Additionally, each of the systems 30, 32, 34, 36, 38 and 40 may be stored in a memory system, such as memory system 26, and may be executable via a processor, such as via processors 24.

In the depicted embodiment, the CAR system 30 may provide for entry of requirements and/or specifications, such as dimensions for the part or product, operational conditions that the part or product is expected to encounter (e.g., temperatures, pressures), certifications to be adhered to, quality control requirements, performance requirements, and so on. The CAD system 32 may provide for a graphical user interface suitable to create and manipulate graphical representations of 2D and/or 3D models as described above with respect to the design processes 14. For example, the 3D design models may include solid/surface modeling, parametric models, wireframe models, vector models, non-uniform rational basis spline (NURBS) models, geometric models, and the like. The CAD system 32 may provide for the creation and update of the 2D and/or 3D models and related information (e.g., views, drawings, annotations, notes, PMI object, etc.). Indeed, the CAD system 32 may combine a graphical representation of the part or product with other, related information. Further, the CAD system 32 may create the PMI and/or objects (e.g., Model Based Definition) displayed on various GUI views and/or orientations of the same part, as discussed in more detail below. The CAD system 32 may then transfer PMI from the first model to a second model.

The CAE system 34 may enable creation of various engineering models, such as the models described above with respect to the development/engineering processes 16. For example, the CAE system 34 may apply engineering principles to create models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models. The CAE system 34 may then apply the aforementioned models to analyze certain part or product properties (e.g., physical properties, thermodynamic properties, fluid flow properties, and so on), for example, to better match the requirements and specifications for the part or product.

The CAM/CIM system 36 may provide for certain automation and manufacturing efficiencies, for example, by deriving certain programs or code (e.g., G-code) and then executing the programs or code to manufacture the part or product. The CAM/CIM system 36 may support certain automated manufacturing techniques, such as additive (or subtractive) manufacturing techniques, including material jetting, binder jetting, vat photopolymerization, powder bed fusion, sheet lamination, directed energy deposition, material extrusion, milling, lathing, plasma cutting, wire cutting, or a combination thereof. The CMM system 38 may include machinery to automate inspections. For example, probe-based, camera-based, and/or sensor-based machinery may automatically inspect the part or product to ensure compliance with certain design geometries, tolerances, shapes, and so on.

The PDM system 40 may be responsible for the management and publication of data from the systems 30, 32, 34, 36, and/or 38. For example, the systems 30, 32, 34, 36, and/or 38 may communicate with data repositories 56, 58, 60 via a data sharing layer 62. The PDM system 40 may then manage collaboration between the systems 30, 32, 34, 36, and/or 38 by providing for data translation services, versioning support, archive management, notices of updates, and so on. The PDM system 40 may additionally provide for business support such as interfacing with supplier/vendor systems and/or logistics systems for purchasing, invoicing, order tracking, and so on. The PDM system 40 may also interface with service/logging systems (e.g., service center data management systems) to aid in tracking the maintenance and life cycle of the part or product as it undergoes operations. Teams 64, 66 may collaborate with team members via a collaboration layer 68. The collaboration layer may include web interfaces, messaging systems, file drop/pickup systems, and the like, suitable for sharing information and a variety of data. The collaboration layer 68 may also include cloud-based systems 70 or communicate with the cloud-based systems 70 that may provide for decentralized computing services and file storage. For example, portions (or all) of the systems 30, 32, 34, 36, 38 may be stored in the cloud 70 and/or accessible via the cloud 70.

The extensibility and customization systems 42, 44, 46, 48, 50, and 52 may provide for functionality not found natively in the CAR system 30, the CAD system 32, the CAE system 34, the CAM/CIM system 36, the CMM system 38 and/or the PDM system 40. For example, computer code or instructions may be added to the systems 30, 32, 34, 36, 38, and/or 40 via shared libraries, modules, software subsystems and the like, included in the extensibility and customization systems 42, 44, 46, 48, 50, and/or 52. The extensibility and customization systems 42, 44, 46, 48, 50, and 52 may also use application programming interfaces (APIs) included in their respective systems 30, 32, 34, 36, 38, and/or 40 to execute certain functions, objects, shared data, software systems, and so on, useful in extending the capabilities of the CAR system 30, the CAD system 32, the CAM/CIM system 36, the CMM system 38 and/or the PDM system 40. By enabling the processes 12, 14, 16, 18, 20, and 22, for example, via the systems 30, 32, 34, 36, and 38 and their respective extensibility and customization systems 42, 44, 46, 48, 50, and 52, the techniques described herein may provide for a more efficient "cradle-to-grave" product lifecycle management.

For example, the extensibility and customization system 44 of the CAD system 32 may be used to copy annotations from a first model 80 into a second model 82 and/or third model. For example, the extensibility and customization system 44 may identify certain objects or entities in the first model 80 that correspond to objects or entities in the second model 82, such as faces, edges, holes, shapes (e.g., geometric shapes, curves), and so on, and then automatically copy PMI associated with the objects or entities identified into the second model.

Figure 3:
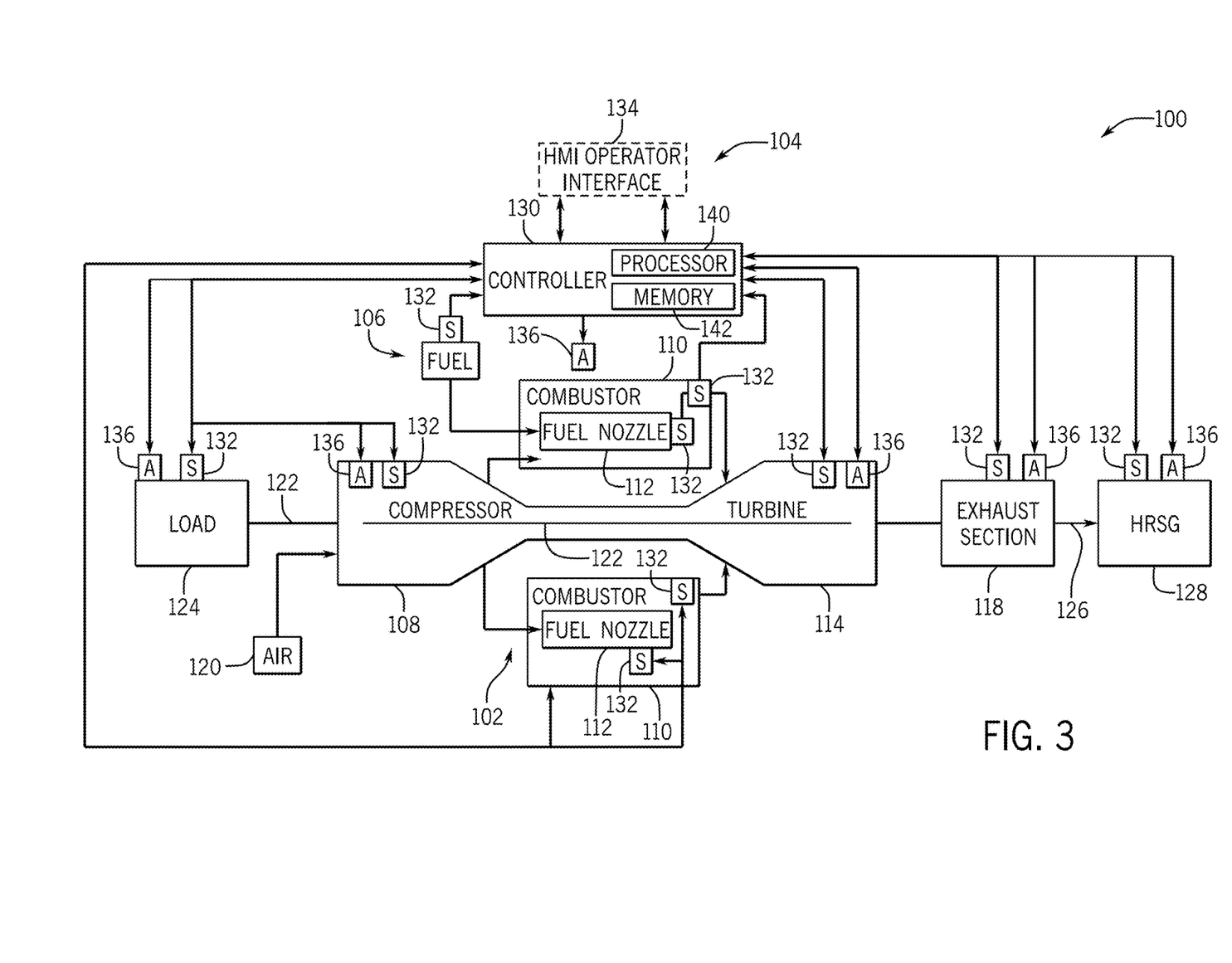
FIG. 3 is block diagram of an industrial system that may be conceived, designed, engineered, manufactured, and/or service and tracked by the CAx system of FIG. 1, in accordance with an aspect of the present disclosure.

It may be beneficial to describe a machine that may incorporate one or more parts manufactured and tracked by the processes 12, 14, 16, 18, 20, and 22, for example, via the CAx system 10. Accordingly, FIG. 3 illustrates an example of a power production system 100 that may be entirely (or partially) conceived, designed, engineered, manufactured, serviced, and tracked by the CAx system 10. As illustrated in FIG. 1, the power production system 100 includes a gas turbine system 102, a monitoring and control system 104, and a fuel supply system 106. The gas turbine system 102 may include a compressor 108, combustion systems 110, fuel nozzles 112, a gas turbine 114, and an exhaust section 118. During operation, the gas turbine system 102 may pull air 120 into the compressor 108, which may then compress the air 120 and move the air 120 to the combustion system 110 (e.g., which may include a number of combustors). In the combustion system 110, the fuel nozzle 112 (or a number of fuel nozzles 112) may inject fuel that mixes with the compressed air 120 to create, for example, an air-fuel mixture.

The air-fuel mixture may combust in the combustion system 110 to generate hot combustion gases, which flow downstream into the turbine 114 to drive one or more turbine stages. For example, the combustion gases may move through the turbine 114 to drive one or more stages of turbine blades, which may in turn drive rotation of a shaft 122. The shaft 122 may connect to a load 124, such as a generator that uses the torque of the shaft 122 to produce electricity. After passing through the turbine 114, the hot combustion gases may vent as exhaust gases 126 into the environment by way of the exhaust section 118. The exhaust gas 126 may include gases such as carbon dioxide ($CO_2$), carbon monoxide (CO), nitrogen oxides ($NO_x$), and so forth.

The exhaust gas 126 may include thermal energy, and the thermal energy may be recovered by a heat recovery steam generation (HRSG) system 128. In combined cycle systems, such as the power plant 100, hot exhaust 126 may flow from the gas turbine 114 and pass to the HRSG 128, where it may be used to generate high-pressure, high-temperature steam. The steam produced by the HRSG 128 may then be passed through a steam turbine engine for further power generation. In addition, the produced steam may also be supplied to any other processes where steam may be used, such as to a gasifier used to combust the fuel in a gasification process to produce the untreated syngas. The gas turbine engine generation cycle is often referred to as the "topping cycle," whereas the steam turbine engine generation cycle is often referred to as the "bottoming cycle." Combining these two cycles may lead to greater efficiencies in both cycles. In particular, exhaust heat from the topping cycle may be captured and used to generate steam for use in the bottoming cycle.

In certain embodiments, the system 100 may also include a controller 130. The controller 130 may be communicatively coupled to a number of sensors 132, a human machine interface (HMI) operator interface 134, and one or more actuators 136 suitable for controlling components of the system 100. The actuators 136 may include valves, switches, positioners, pumps, and the like, suitable for controlling the various components of the system 100. The controller 130 may receive data from the sensors 132, and may be used to control the compressor 108, the combustors 110, the turbine 114, the exhaust section 118, the load 124, the HRSG 128, and so forth.

In certain embodiments, the HMI operator interface 134 may be executable by one or more computer systems of the system 100. A plant operator may interface with the industrial system 10 via the HMI operator interface 44. Accordingly, the HMI operator interface 134 may include various input and output devices (e.g., mouse, keyboard, monitor, touch screen, or other suitable input and/or output device) such that the plant operator may provide commands (e.g., control and/or operational commands) to the controller 130.

The controller 130 may include a processor(s) 140 (e.g., a microprocessor(s)) that may execute software programs to perform certain techniques. Moreover, the processor 140 may include multiple microprocessors, one or more "general-purpose" microprocessors, one or more special-purpose microprocessors, and/or one or more application specific integrated circuits (ASICS), or some combination thereof. For example, the processor 39 may include one or more reduced instruction set (RISC) processors. The controller 130 may include a memory device 142 that may store information such as control software, look up tables, configuration data, etc. The memory device 142 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 4:
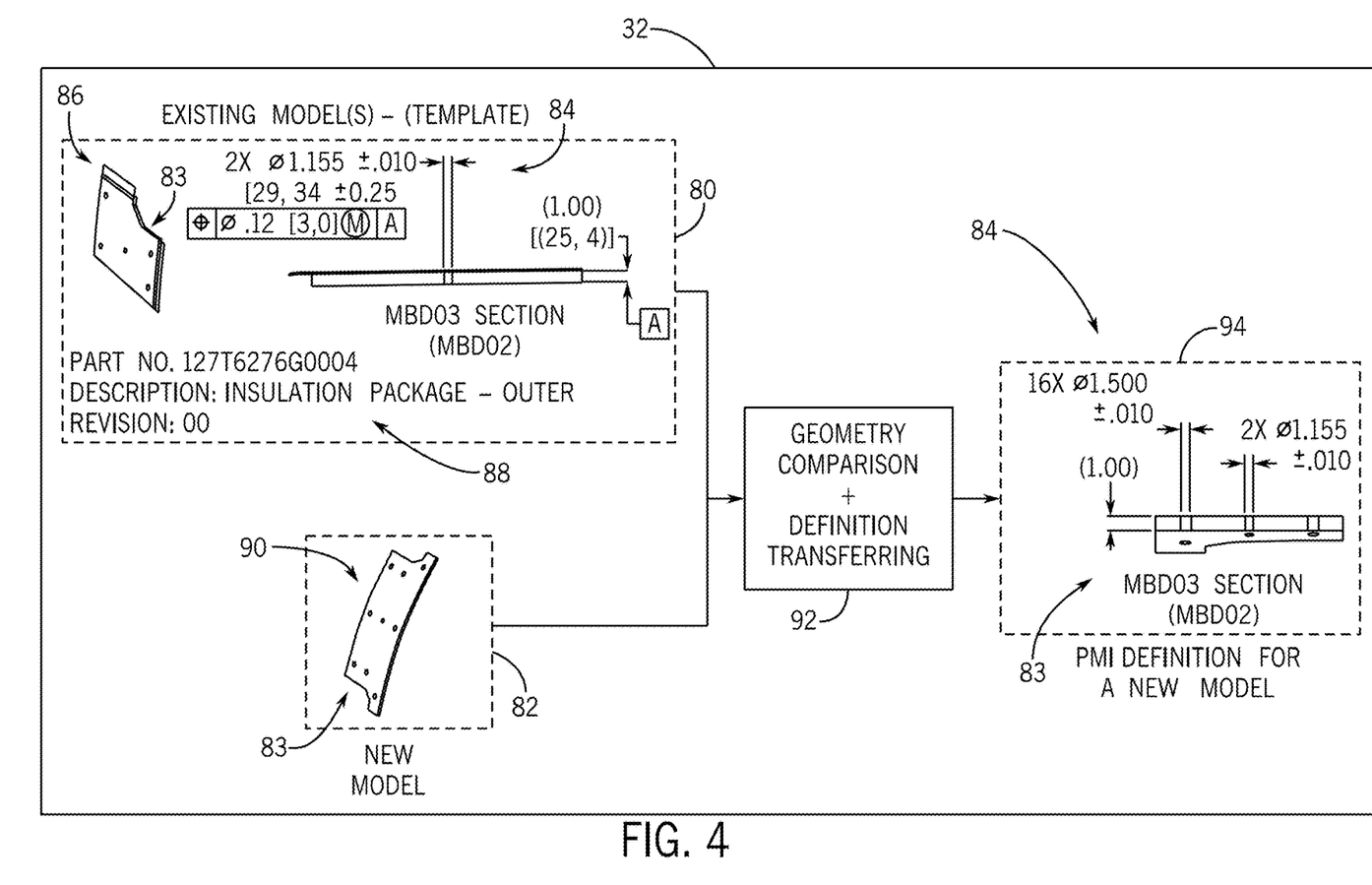
FIG. 4 is a block diagram illustrating an embodiment of a CAD system suitable for generating PMI and transferring, recreating, or otherwise copying the PMI and other information from one model to another model.

Drawings and/or models for the aforementioned parts of the industrial machinery may be generated to aid in the processes 12, 14, 16, 18, 20, and 22, for example, via the CAx system 10. More specifically, the models may have MBD 84, including PMI displayed as objects (e.g., GUI objects such as annotations, callouts, notes, and/or text indicative) that are found in the first model 80, as shown in FIG. 4. More specifically, FIG. 4 is a block diagram illustrating an embodiment of the CAD system 32, which may generate the models 80, 82, and MBD 84, including PMI. MBD may include multiple PMI objects, e.g., multiple dimensions and notes.

In more detail, the first model 80 generated by the CAD system 32 may be a 3D "drawing" of a part or an assembly of, for example, industrial machinery, where PMI annotations are attached to the model directly. That is, a first model 80 may be a 3D representation of a part 86, such that a 3D representation 88 of the part 86 may be manipulated and/or oriented to any given view on the CAD system 32 via inputs to a user interface on the CAD system 32. For example, the user interface may contain an arrow that may be used (e.g., via a user input like a computer mouse) to manipulate and/or orient the first model 80 of a part to a specified view. As such, some views of the first model 80 may contain more details or different details than that of other views. For example, a front view of a first model 80 may show features 83 (e.g., edges, faces, curves, holes, bevels) only on the front face of the part displayed by first model 80, that may not be show in other views.

Furthermore, MBD 84, including PMI may be associated with the first model 80. The MBD 84 may be stored in the memory or the data-sharing layer mentioned above. As mentioned above, PMI may be any description of the feature 83 that may be used and aid in the manufacturing of the feature 83 into a part containing said feature 83. For example, the first model 80 may be a part of industrial machinery, such that the part includes certain curved geometry, edges, finishes, tolerances, hardness, and so on. In certain embodiments, the feature(s) 83 and its generated PMI 84 may be compiled and stored in the memory and/or data repositories mentioned above. That is, each feature 83 may be stored so that the feature 83 is linked to one or more PMI 84. It is also to be noted that the feature 83 may be another PMI, e.g., the text, lines, and so on, displayed as part of a PMI.

Once the second model 82 is created, a part 90 may also be created for the second model 92. The techniques described herein may then automatically analyze the created part 90 to derive features 83. For example, the part 90 may be analyzed via geometric analysis to determine if features found in the part 90 may be the same or like features (e.g., feature 83) found in the first model 80. Geometric analysis may include machine learning systems (e.g., neural networks, support vector machines, data mining clustering systems, and so on), that are trained to identify geometric features and the like (e.g., edges, faces, curves, holes, bevels). Geometric analysis may also include feature identification based on using the feature 83 and comparing the feature 83 against various features of the part 90 (and/or any other part of the model 82) to determine if the feature 83 is found. Graph based systems may also be used, that may translate the displayed features as nodes in a graph to determine if the features are found. Once the feature 83 is found, then the PMI 84 may be copied over, resulting in an updated (or a new model) 94. Indeed, the model 94 may include the feature 83 with the PMI 84, thus providing for an automated way to transfer PMI over from a first model (e.g., model 80) into a second model (e.g., model 94). It is to be noted that in some cases, the first and the second model may be either identical such as when the first model is saved with a new name, creating the second model. The first model may have had PMI inserted later, creating two versions.

Figure 5:
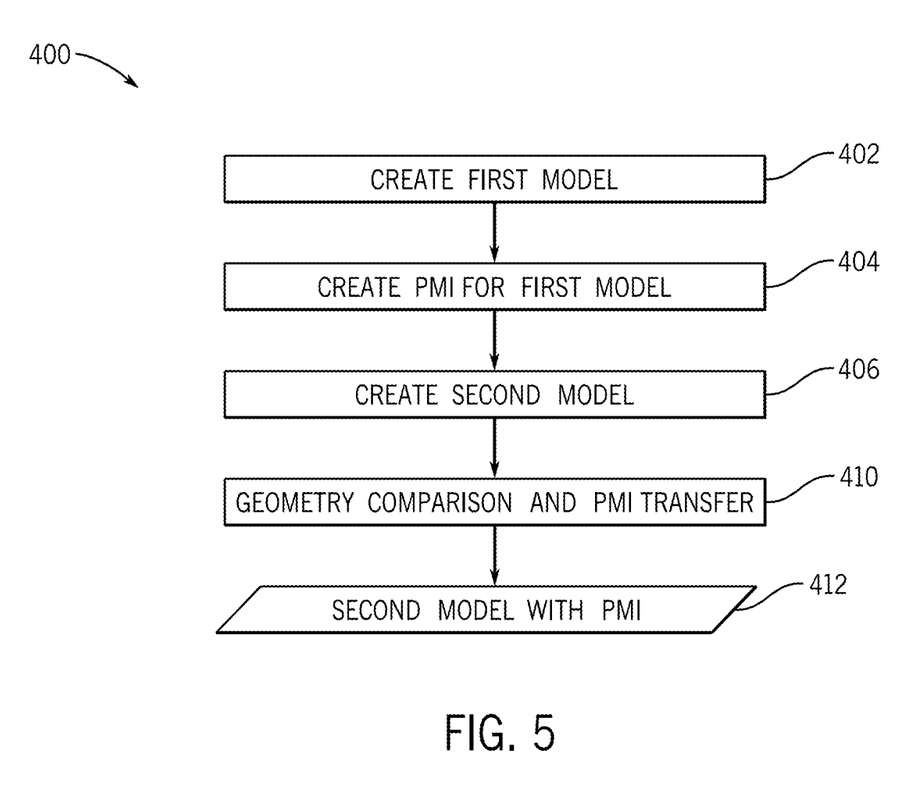
FIG. 5 flowchart illustrating an embodiment of a process suitable for transferring or otherwise copying model based definitions including PMI from a first model into a second model.

FIG. 5 is a flowchart illustrating an embodiment of a process 400 suitable for transferring MBD, including PMI, from a first model into a second model. The process 400 may be implemented as computer code or instructions executable, for example, by the CAD system 32. In the depicted embodiment, the process 400 may first create (block 402), a first model. For example, the first model may be the model 80 shown in FIG. 4 created by the CAD system 32. The process 400 may then create (block 404) MBD, including PMI for the first model. For example, the process 400 may enable a user to enter PMI, such as the PMI 84, and associate or otherwise link (block 404) the PMI with one or more parts (e.g., part 90) in the first model.

The process 400 may then create (block 406), a second model. For example, the CAD system 32 may be used to create the second model, e.g., model 82. The process 400 may then, for each feature in the first model, derive (block 410) a geometric comparison of features found in the second model. That is, each feature having MBD such as PMI, e.g., feature 83, in the first model that has PMI may be searched for in the second model. When a feature is found in the second model, the MBD 84, e.g., PMI, from the first model may be recreated (block 410) into the second model. The process 400 may also, before recreating the MBD 84 in the second model, also recreate a view in the second model, such as a standard view, a detail view, and/or a section view that has the MBD 84 in the first model. That is, as the MBD 84, such as PMI is found, the process 400 may then also recreate the same view that has the MBD in the second model.

This written description uses examples to disclose the claimed subject matter, including the best mode, and also to enable any person skilled in the art to practice the claimed disclosure, including making and using any devices or systems and performing any incorporated methods. The patentable scope of the claimed disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system, comprising:
 a processor for implementing a computer-aided technology (CAx) system, the CAx system comprising a graphical-user-interface (GUI) configured to present a first computer-aided design (CAD) model, the first CAD model comprising a first part;
 memory storing instructions configured to cause the processor to:
  present the GUI;
  display, via the GUI, a first product manufacturing information (PMI), wherein the first PMI is linked to a first feature of the first part included in the first CAD model;
  determine if the first CAD model and a second CAD model are different versions of the same model and copy the PMI to the second CAD model if the second CAD model is a different version of the same model;

otherwise iterate through the second CAD model to identify a second feature related to the first feature; and copy the PMI to the second feature of the second CAD model, wherein the instructions configured to cause the processor to copy the PMI to the second feature comprise instructions that determine if a view found in the first model having the first PMI exists in the second model, and if the view does not exist creating the view in the second model and then copying the PMI.

2. The system of claim 1, wherein the first PMI comprises a dimension information, a coating information, a manfacturing information for manufacturing the at least one part, or a combination thereof, and wherein the first feature comprises an edge, a curve, a hole, a face, a line, a second PMI, or a combination thereof.

3. The system of claim 1, wherein the instructions are configured to cause the processor to identify the second feature related to the first feature by executing a geometric analysis between the first feature and the second feature.

4. The system of claim 3, wherein the geometric analysis comprises comparing a geometry of an edge, a curve, a face, a line, a plane, or a combination thereof, found in the first feature, against second geometry of a second edge, a second curve, a second face, a second line, a second plane, or a combination thereof, found in the second feature.

5. The system of claim 3, wherein the geometric analysis comprises executing a machine learning system configured to be trained to detect the second feature based on data points included in the first feature.

6. The system of claim 1, wherein the first CAD model is a different model than the second CAD model.

7. The system of claim 1, wherein the first CAD model is the same model as the second CAD model.

8. The system of claim 1, wherein the instructions are configured to cause the processor to:

display, via the GUI, a second PMI, wherein the second PMI is linked to a third feature of the first part included in the first CAD model;

iterate through the second CAD model to identify a fourth feature related to the third feature; and copy the second PMI to the fourth feature of the second CAD model.

9. A method, comprising:

presenting, via a processor, a graphical user interface (GUI);

displaying, via the GUI, a first product manufacturing information (PMI), wherein the first PMI is linked to a first feature of a first part included in a first CAD model;

determining if the first CAD model and a second CAD model are different versions of the same model and copy the PMI to the second CAD model if the second CAD model is a different version of the same model;

otherwise iterating through the second CAD model to identify a second feature related to the first feature; and copying the PMI to the second feature of the second CAD model, wherein copying the PMI to the second feature comprises determining if a view found in the first model having the first PMI exists in the second model, and if the view does not exist creating the view in the second model and then copying the PMI.

10. The method of claim 9, comprising identifying, via the processor, the second feature related to the first feature by executing a geometric analysis between the first feature and the second feature.

11. The method of claim 10, wherein the geometric analysis comprises comparing a geometry of an edge, a curve, a face, a line, a plane, or a combination thereof, found in the first feature, against second geometry of a second edge, a second curve, a second face, a second line, a second plane, or a combination thereof, found in the second feature.

12. The method of claim 10, wherein the geometric analysis comprises executing a machine learning system configured to be trained to detect the second feature based on data points included in the first feature.

13. The method of claim 9, comprising:

displaying, via the GUI, a second PMI, wherein the second PMI is linked to a third feature of the first part included in the first CAD model;

iterating through the second CAD model to identify a fourth feature related to the third feature; and copying the second PMI to the fourth feature of the second CAD model.

14. A tangible, non-transitory, computer-readable medium, comprising computer-readable instructions that, when executed by one or more processors of a computer, cause the one or more processors to:

present, via a processor, a graphical user interface (GUI);

display, via the GUI, a first product manufacturing information (PMI), wherein the first PMI is linked to a first feature of the first part included in a first CAD model;

determine if the first CAD model and a second CAD model are different versions of the same model and copy the PMI to the second CAD model if the second CAD model is a different version of the same model;

otherwise iterate through the second CAD model to identify a second feature related to the first feature; and copy the PMI to the second feature of the second CAD model, wherein the computer-readable instructions that, when executed by one or more processors of the computer, cause the one or more processors to copy the PMI to the second feature comprise instructions that determine if a view found in the first model having the first PMI exists in the second model, and if the view does not exist creating the view in the second model and then copying the PMI.

15. The computer-readable medium of claim 14, wherein the first PMI comprises a tolerance, a dimension information, a coating information, a manfacturing information for manufacturing the at least one part, or a combination thereof.

16. The computer-readable medium of claim 14, wherein the first feature comprises an edge, a curve, a hole, a face, a line, a second PMI or a combination thereof.

17. The computer-readable medium of claim 14, wherein the instructions to identify the second feature related to the first feature comprise instructions to execute a geometric analysis between the first feature and the second feature.

18. The computer-readable medium of claim 17, wherein the geometric analysis comprises comparing a geometry of an edge, a curve, a face, a line, a plane, or a combination thereof, found in the first feature, against second geometry of a second edge, a second curve, a second face, a second line, a second plane, or a combination thereof, found in the second feature.

19. The computer-readable medium of claim 17, wherein the geometric analysis comprises executing a machine learning system configured to be trained to detect the second feature based on data points included in the first feature.

* * * * *